(12) United States Patent
Murakami

(10) Patent No.: US 10,759,917 B2
(45) Date of Patent: Sep. 1, 2020

(54) CONDUCTIVE FILM AND METHOD FOR PRODUCING SAME

(71) Applicant: ZEON CORPORATION, Chiyoda-ku, Tokyo (JP)

(72) Inventor: Toshihide Murakami, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 78 days.

(21) Appl. No.: 16/310,892

(22) PCT Filed: Jul. 14, 2017

(86) PCT No.: PCT/JP2017/025772
§ 371 (c)(1),
(2) Date: Dec. 18, 2018

(87) PCT Pub. No.: WO2018/016442
PCT Pub. Date: Jan. 25, 2018

(65) Prior Publication Data
US 2019/0248974 A1 Aug. 15, 2019

(30) Foreign Application Priority Data
Jul. 20, 2016 (JP) ................................ 2016-142099

(51) Int. Cl.
| | | |
|---|---|---|
| *C08J 7/044* | (2020.01) |
| *B29C 71/00* | (2006.01) |
| *C23C 14/02* | (2006.01) |
| *H01L 29/43* | (2006.01) |
| *C08J 7/04* | (2020.01) |
| *B32B 27/00* | (2006.01) |
| *B29C 71/02* | (2006.01) |
| *B32B 7/02* | (2019.01) |
| *B32B 27/32* | (2006.01) |
| *B29C 48/08* | (2019.01) |
| *B29C 48/00* | (2019.01) |
| *B29K 23/00* | (2006.01) |
| *C23C 14/08* | (2006.01) |
| *C23C 14/35* | (2006.01) |

(52) U.S. Cl.
CPC ......... *C08J 7/0427* (2020.01); *B29C 48/0018* (2019.02); *B29C 48/08* (2019.02); *B29C 71/0063* (2013.01); *B29C 71/02* (2013.01); *B32B 7/02* (2013.01); *B32B 27/00* (2013.01); *B32B 27/32* (2013.01); *C08J 7/04* (2013.01); *C23C 14/024* (2013.01); *B29C 2071/022* (2013.01); *B29K 2023/38* (2013.01); *B29K 2995/0005* (2013.01); *B29K 2995/0041* (2013.01); *C08J 7/044* (2020.01); *C08J 2365/00* (2013.01); *C08J 2465/00* (2013.01); *C23C 14/086* (2013.01); *C23C 14/35* (2013.01); *H01L 29/43* (2013.01)

(58) Field of Classification Search
CPC ............. B29C 71/02; B29C 2071/022; B29C 2071/025; B29C 2071/027
See application file for complete search history.

(56) References Cited

U.S. PATENT DOCUMENTS

| | | | | |
|---|---|---|---|---|
| 3,857,730 A | * | 12/1974 | Kalafus | ...................... C08J 5/06 156/331.5 |
| 2014/0370297 A1 | | 12/2014 | Kim et al. | |
| 2015/0378461 A1 | | 12/2015 | Hashimoto et al. | |
| 2017/0306113 A1 | | 10/2017 | Murakami et al. | |

FOREIGN PATENT DOCUMENTS

| | | |
|---|---|---|
| JP | 2005038661 A | 2/2005 |
| JP | 2014168886 A | 9/2014 |
| JP | 2015004046 A | 1/2015 |
| TW | 201615708 A | 5/2016 |
| WO | 2016067893 A1 | 5/2016 |

OTHER PUBLICATIONS

Polymerdatabase.com entry for poly(cyclohexandimethylene terephthalate) (Year: 2016).*
Sep. 26, 2017, International Search Report issued in the International Patent Application No. PCT/JP2017/025772.
Jan. 22, 2019, International Preliminary Report on Patentability issued in the International Patent Application No. PCT/JP2017/025772.

* cited by examiner

*Primary Examiner* — Ramsey Zacharia
(74) *Attorney, Agent, or Firm* — Kenja IP Law PC

(57) ABSTRACT

An electroconductive film including a substrate film, and an organic electroconductive layer disposed on the substrate film, wherein the substrate film is formed of a resin containing an alicyclic structure-containing polymer having crystallizability, a thickness of the substrate film is 5 μm or more and 50 μm or less, and a crystallization degree of the alicyclic structure-containing polymer having crystallizability is 30% or more. The alicyclic structure-containing polymer having crystallizability is preferably a hydrogenated product of a ring-opening polymer of dicyclopentadiene.

5 Claims, No Drawings

CONDUCTIVE FILM AND METHOD FOR PRODUCING SAME

FIELD

The present invention relates to an electroconductive film and a method for producing the same.

BACKGROUND

It has been known in prior art to form an electroconductive layer on a substrate film formed of a resin, to thereby obtain an electroconductive film including the substrate film and the electroconductive layer. The electroconductive film has been used for various applications taking advantage of the flexibility and electroconductivity thereof. For example, use of the electroconductive film for a component of a touch panel, a component of a flexible display device, and the like has been known.

As the electroconductive layer of the electroconductive film, an inorganic electroconductive layer formed of indium tin oxide (ITO) or the like has been often used (for example, Patent Literature 1). Further, use of an organic electroconductive layer that may be formed more inexpensively and easily as the electroconductive layer has also been proposed (for example, Patent Literatures 2 and 3).

CITATION LIST

Patent Literature

Patent Literature 1: International Publication No. 2016/067893
Patent Literature 2: Japanese Patent Application Laid-Open No. 2014-168886 A (corresponding foreign application: U.S. patent application publication No. 2015/378461)
Patent Literature 3: Japanese Patent Application Laid-Open No. 2015-004046 A (corresponding foreign application: U.S. patent application publication No. 2014/370297)

SUMMARY

Technical Problem

In order to secure high durability in applications required for flexibility, an electroconductive film having high bend resistance is desired. The electroconductive film including an organic electroconductive layer as an electroconductive layer is more advantageous in the bend resistance than the electroconductive film including an inorganic electroconductive layer. However, a further improvement in bend resistance is required.

Therefore, an object of the present invention is to provide an electroconductive film having high bend resistance and a method for producing the same.

Solution to Problem

The inventor has investigated to solve the above-described problems, and as a result, found that when a specific resin containing an alicyclic structure-containing polymer is employed as a material for a substrate film to form a substrate film having a specific thickness and the substrate film is combined with an organic electroconductive layer, an electroconductive film having high bend resistance can be obtained. The present invention has been completed on the basis of the findings described above.

Accordingly, the present invention provides as follow.
(1) An electroconductive film comprising a substrate film, and an organic electroconductive layer disposed on the substrate film, wherein
the substrate film is formed of a resin containing an alicyclic structure-containing polymer having crystallizability,
a thickness of the substrate film is 5 μm or more and 50 μm or less, and
a crystallization degree of the alicyclic structure-containing polymer having crystallizability is 30% or more.
(2) The electroconductive film according to (1), wherein the alicyclic structure-containing polymer having crystallizability is a hydrogenated product of a ring-opening polymer of dicyclopentadiene.
(3) The electroconductive film according to (1) or (2), wherein the organic electroconductive layer contains polyethylenedioxythiophene.
(4) A method for producing the electroconductive film according to any one of (1) to (3), the method comprising the steps of:
preparing a primary film formed of the resin containing the alicyclic structure-containing polymer having crystallizability;
obtaining the substrate film from the primary film; and
forming the organic electroconductive layer on the substrate film.
(5) The method for producing the electroconductive film according to (4), wherein
the step of obtaining the substrate film includes
a step of stretching the primary film, and
a crystallization step of crystallizing the alicyclic structure-containing polymer contained in the primary film.
(6) The method for producing the electroconductive film according to (5), wherein the crystallization step is performed at a temperature that is equal to or higher than a glass transition temperature Tg of the alicyclic structure-containing polymer and equal to or lower than a melting point Tm of the alicyclic structure-containing polymer in a strained state where at least two edges of the primary film are held.

Advantageous Effects of Invention

According to the present invention, an electroconductive film having high bend resistance and a method for producing the same are provided.

DESCRIPTION OF EMBODIMENTS

Hereinafter, the present invention will be described in detail with reference to embodiments and examples. However, the present invention is not limited to the following embodiments and examples, and may be freely modified for implementation without departing from the scope of claims of the present invention and the scope of their equivalents.

In the following description, a "long-length" film refers to a film with the length that is 5 times or more the width, and preferably a film with the length that is 10 times or more the width, and specifically refers to a film having a length that allows a film to be wound up into a rolled shape for storage or transportation. The upper limit of the ratio of the length of the film relative to the width thereof is not particularly limited, but is usually 100,000 times or less.

In the following description, directions of elements being "parallel", "perpendicular", and "orthogonal" may allow an error within the range of not impairing the advantageous effects of the present invention, for example, within a range of ±5°, unless otherwise specified.

In the following description, the lengthwise direction of the long-length film is usually parallel to the film conveyance direction in the production line.

[1. Summary of Electroconductive Film]

The electroconductive film according to the present invention includes a substrate film and an organic electroconductive layer disposed on the substrate film.

[2. Substrate Film]

The substrate film is a film formed of a resin containing an alicyclic structure-containing polymer having crystallizability. In the following description, the aforementioned resin may be referred to as "crystallizable resin".

[2.1. Crystallizable Resin]

The crystallizable resin includes an alicyclic structure-containing polymer having crystallizability. Herein, the alicyclic structure-containing polymer refers to a polymer that has an alicyclic structure in the molecule and can be obtained by a polymerization reaction using a cyclic olefin as a monomer, or a hydrogenated product thereof. As the alicyclic structure-containing polymer, one type thereof may be solely used, and two or more types thereof may also be used in combination at any ratio.

Examples of the alicyclic structure contained in the alicyclic structure-containing polymer may include a cycloalkane structure, and a cycloalkene structure. Among these, a cycloalkane structure is preferable from the viewpoint of easily obtaining a substrate film excellent in properties such as thermal stability. The number of carbon atoms contained per alicyclic structure is preferably 4 or more, and more preferably 5 or more, and is preferably 30 or less, more preferably 20 or less, and particularly preferably 15 or less. When the number of carbon atoms contained in one alicyclic structure falls within the aforementioned range, mechanical strength such as bend resistance, heat resistance, and moldability are highly balanced.

In the alicyclic structure-containing polymer, the ratio of the structural unit having an alicyclic structure relative to all structural units is preferably 30% by weight or more, more preferably 50% by weight or more, and particularly preferably 70% by weight or more. When the ratio of the structural unit having an alicyclic structure in the alicyclic structure-containing polymer is increased as described above, the advantageous effects of the present invention such as bend resistance can be further enhanced.

The rest of the alicyclic structure-containing polymer other than the structural unit having an alicyclic structure is not particularly limited, and may be appropriately selected depending on the purposes of use.

The alicyclic structure-containing polymer contained in the crystallizable resin has crystallizability. The "alicyclic structure-containing polymer having crystallizability" herein refers to an alicyclic structure-containing polymer having a melting point Tm (specifically, a melting point thereof can be observed by a differential scanning calorimeter (DSC)). The melting point Tm of the alicyclic structure-containing polymer is preferably 200° C. or higher, and more preferably 230° C. or higher, and is preferably 290° C. or lower. By using the alicyclic structure-containing polymer having such a melting point Tm, crystallization degree desired in the present invention can be easily achieved.

The weight-average molecular weight (Mw) of the alicyclic structure-containing polymer is preferably 1,000 or more, and more preferably 2,000 or more, and is preferably 1,000,000 or less, and more preferably 500,000 or less. The alicyclic structure-containing polymer having such a weight-average molecular weight has excellent balance of molding processability and bend resistance.

The molecular weight distribution ((Mw)/(Mn)) of the alicyclic structure-containing polymer is preferably 1.0 or more, and more preferably 1.5 or more, and is preferably 4.0 or less, and more preferably 3.5 or less. Herein, Mn represents a number-average molecular weight. The alicyclic structure-containing polymer having such a molecular weight distribution has excellent molding processability.

The weight-average molecular weight (Mw) and the molecular weight distribution (Mw/Mn) of the alicyclic structure-containing polymer may be measured as a polystyrene-equivalent value by gel permeation chromatography (GPC) using tetrahydrofuran as a developing solvent.

The glass transition temperature Tg of the alicyclic structure-containing polymer is not particularly limited, but is usually 85° C. or higher and is usually 170° C. or lower.

Examples of the alicyclic structure-containing polymer may include the following polymer (α) to polymer (δ). Among these, the polymer (β) is preferable as the crystallizable alicyclic structure-containing polymer because a substrate film having excellent bend resistance can therewith be easily obtained.

Polymer (α): a ring-opening polymer of a cyclic olefin monomer having crystallizability Polymer (β): a hydrogenated product of the polymer (a) having crystallizability Polymer (γ): an addition polymer of a cyclic olefin monomer having crystallizability Polymer (δ): a hydrogenated product and the like of the polymer (γ) having crystallizability Specifically, the alicyclic structure-containing polymer is more preferably a ring-opening polymer of dicyclopentadiene having crystallizability or a hydrogenated product of the ring-opening polymer of dicyclopentadiene having crystallizability, and particularly preferably a hydrogenated product of the ring-opening polymer of dicyclopentadiene having crystallizability. Herein, the ring-opening polymer of dicyclopentadiene refers to a polymer in which the ratio of a structural unit derived from dicyclopentadiene relative to all structural units is usually 50% by weight or more, preferably 70% by weight or more, more preferably 90% by weight or more, and further preferably 100% by weight.

Hereinafter, methods for producing the polymer (α) and the polymer (β) will be described.

The cyclic olefin monomer available for producing the polymer (α) and the polymer (β) is a compound which has a ring structure formed of carbon atoms and includes a carbon-carbon double bond in the ring. Examples of the cyclic olefin monomer may include a norbornene-based monomer. When the polymer (α) is a copolymer, a monocyclic olefin may be used as the cyclic olefin monomer.

The norbornene-based monomer is a monomer containing a norbornene ring. Examples of the norbornene-based monomer may include a bicyclic monomer such as bicyclo[2.2.1]hept-2-ene (common name: norbornene) and 5-ethylidene-bicyclo[2.2.1]hept-2-ene (common name: ethylidene norbornene) and derivatives thereof (for example, those with a substituent on the ring); a tricyclic monomer such as tricyclo[4.3.0.1$^{2,5}$]deca-3,7-diene (common name: dicyclopentadiene) and derivatives thereof; and a tetracyclic monomer such as 7,8-benzotricyclo[4.3.0.1$^{2,5}$]dec-3-ene (common name: methanotetrahydrofluorene: also referred to as 1,4-methano-1,4,4a,9a-tetrahydrofluorene) and derivatives thereof, tetracyclo[4.4.0.1$^{2,5}$.1$^{7,10}$]dodec-3-ene (common name: tetracyclododecene), and 8-ethylidenetetracyclo[4.4.0.1$^{2,5}$.1$^{7,10}$]-3-dodecene and derivatives thereof.

Examples of the substituent in the aforementioned monomer may include: an alkyl group such as a methyl group and an ethyl group; an alkenyl group such as a vinyl group; an alkylidene group such as propane-2-ylidene; an aryl group such as a phenyl group; a hydroxy group; an acid anhydride group; a carboxyl group; and an alkoxycarbonyl group such as a methoxycarbonyl group. As the aforementioned substituent, one type thereof may be solely used, and two or more types thereof may also be used in combination at any ratio.

Examples of the monocyclic olefin may include cyclic monoolefins such as cyclobutene, cyclopentene, methylcyclopentene, cyclohexene, methylcyclohexene, cycloheptene, and cyclooctene; and cyclic diolefins such as cyclohexadiene, methylcyclohexadiene, cyclooctadiene, methylcyclooctadiene, and phenylcyclooctadiene.

As the cyclic olefin monomer, one type thereof may be solely used, and two or more types thereof may also be used in combination at any ratio. When two or more types of the cyclic olefin monomers are used, the polymer (α) may be a block copolymer or a random copolymer.

Some of the cyclic olefin monomers may allow presence of endo- and exo-stereoisomers. As the cyclic olefin monomer, any of the endo- and exo-isomers may be used. One of the endo- and exo-isomers may be solely used, and an isomer mixture containing the endo- and exo-isomers at any ratio may also be used. In particular, it is preferable that the ratio of one of the endo- and exo-isomers is at a high level because crystallizability of the alicyclic structure-containing polymer is thereby enhanced and a substrate film having excellent bend resistance can thereby be easily obtained. For example, the ratio of the endo- or exo-isomer is preferably 80% or more, more preferably 90% or more, and further preferably 95% or more. It is preferable that the ratio of the endo-isomer is high because it can be easily synthesized.

Usually, the polymer (α) and the polymer (β) may have increased crystallizability by increasing the degree of syndiotactic stereoregularity thereof (the ratio of the racemo diad). From the viewpoint of increasing the degree of stereoregularity of the polymer (α) and the polymer (β), the ratio of the racemo diad in the structural units of the polymer (α) and the polymer (β) is preferably 51% or more, more preferably 60% or more, and particularly preferably 70% or more.

The ratio of the racemo diad may be measured by $^{13}$C-NMR spectrum analysis. Specifically, the measurement may be performed by the following method.

The $^{13}$C-NMR measurement of a polymer sample is performed at 200° C. with ortho-dichlorobenzene-d$^4$ as a solvent by an inverse-gated decoupling method. From the result of this $^{13}$C-NMR measurement, a signal at 43.35 ppm attributable to the meso diad and a signal at 43.43 ppm attributable to the racemo diad are identified with the peak at 127.5 ppm of ortho-dichlorobenzene-d$^4$ as a reference shift. On the basis of the intensity ratio of these signals, the ratio of the racemo diad of the polymer sample may be determined.

For the synthesis of the polymer (α), a ring-opening polymerization catalyst is usually used. As the ring-opening polymerization catalyst, one type thereof may be solely used, and two or more types thereof may also be used in combination at any ratio. As such a ring-opening polymerization catalyst for synthesis of the polymer (α), a ring-opening polymerization catalyst that can cause ring-opening polymerization of the cyclic olefin monomer to produce a ring-opening polymer having syndiotactic stereoregularity is preferable. Preferable examples of the ring-opening polymerization catalyst may include those including a metal compound represented by the following formula (1):

$$M(NR^1)X_{4-a}(OR^2)_a \cdot L_b \qquad (1)$$

(In the formula (1),

M is a metal atom selected from the group consisting of the Group 6 transition metal atoms in the periodic table, R$^1$ is a phenyl group optionally having a substituent at one or more of 3-, 4-, and 5-positions, or a group represented by —CH$_2$R$^3$ (wherein R$^3$ is a group selected from the group consisting of a hydrogen atom, an alkyl group optionally having a substituent, and an aryl group optionally having a substituent), R$^2$ is a group selected from the group consisting of an alkyl group optionally having a substituent and an aryl group optionally having a substituent, X is a group selected from the group consisting of a halogen atom, an alkyl group optionally having a substituent, an aryl group optionally having a substituent, and an alkylsilyl group, L is a neutral electron donor ligand, a is a number of 0 or 1, and b is an integer of 0 to 2.)

In the formula (1), M is a metal atom selected from the group consisting of the Group 6 transition metal atoms in the periodic table. M is preferably chromium, molybdenum, or tungsten, more preferably molybdenum or tungsten, and particularly preferably tungsten.

In the formula (1), R$^1$ is a phenyl group optionally having a substituent at one or more of the 3-, 4-, and 5-positions, or a group represented by —CH$_2$R$^3$.

The number of carbon atoms of the phenyl group optionally having a substituent at one or more of the 3-, 4-, and 5-positions of R$^1$ is preferably 6 to 20, and more preferably 6 to 15. Examples of the substituent may include an alkyl group such as a methyl group and an ethyl group; a halogen atom such as a fluorine atom, a chlorine atom, and a bromine atom; and an alkoxy group such as a methoxy group, an ethoxy group, and an isopropoxy group. As the substituent, one type thereof may be solely used, and two or more types thereof may also be used in combination at any ratio. In R$^1$, the substituents present at two or more of the 3-, 4-, and 5-positions may be bonded to each other, to form a ring structure.

Examples of the phenyl group optionally having a substituent at one or more of the 3-, 4-, and 5-positions may include an unsubstituted phenyl group; a monosubstituted phenyl group such as a 4-methylphenyl group, a 4-chlorophenyl group, a 3-methoxyphenyl group, a 4-cyclohexylphenyl group, and a 4-methoxyphenyl group; a disubstituted phenyl group such as a 3,5-dimethylphenyl group, a 3,5-dichlorophenyl group, a 3,4-dimethylphenyl group, and a 3,5-dimethoxyphenyl group; a trisubstituted phenyl group such as a 3,4,5-trimethylphenyl group, and a 3,4,5-trichlorophenyl group; and a 2-naphthyl group optionally having a substituent such as a 2-naphthyl group, a 3-methyl-2-naphthyl group, and a 4-methyl-2-naphthyl group.

In the group represented by —CH$_2$R$^3$ of R$^1$, R$^3$ is a group selected from the group consisting of a hydrogen atom, an alkyl group optionally having a substituent, and an aryl group optionally having a substituent.

The number of carbon atoms in the alkyl group optionally having a substituent of R$^3$ is preferably 1 to 20, and more preferably 1 to 10. This alkyl group may be either linear or branched. Examples of the substituent may include a phenyl group optionally having a substituent such as a phenyl group and a 4-methylphenyl group; and an alkoxyl group such as a methoxy group and an ethoxy group. As the substituent, one type thereof may be solely used, and two or more types thereof may also be used in combination at any ratio.

Examples of the alkyl group optionally having a substituent of $R^3$ may include a methyl group, an ethyl group, a propyl group, an isopropyl group, a butyl group, an isobutyl group, a t-butyl group, a pentyl group, a neopentyl group, a benzyl group, and a neophyl group.

The number of carbon atoms in the aryl group optionally having a substituent of $R^3$ is preferably 6 to 20, and more preferably 6 to 15. Examples of the substituent may include an alkyl group such as a methyl group and an ethyl group; a halogen atom such as a fluorine atom, a chlorine atom, and a bromine atom; and an alkoxy group such as a methoxy group, an ethoxy group, and an isopropoxy group. As the substituent, one type thereof may be solely used, and two or more types thereof may also be used in combination at any ratio.

Examples of the aryl group optionally having a substituent of $R^3$ may include a phenyl group, a 1-naphthyl group, a 2-naphthyl group, a 4-methylphenyl group, and a 2,6-dimethylphenyl group.

Among these, the group represented by $R^3$ is preferably an alkyl group of 1 to 20 carbon atoms.

In the formula (1), $R^2$ is a group selected from the group consisting of an alkyl group optionally having a substituent and an aryl group optionally having a substituent. As the alkyl group optionally having a substituent and the aryl group optionally having a substituent of $R^2$, a group selected from groups shown as the alkyl groups optionally having a substituent and the aryl groups optionally having a substituent, respectively, of $R^3$ may be optionally used.

In the formula (1), X is a group selected from the group consisting of a halogen atom, an alkyl group optionally having a substituent, an aryl group optionally having a substituent, and an alkylsilyl group.

Examples of the halogen atom of X may include a chlorine atom, a bromine atom, and an iodine atom.

As the alkyl group optionally having a substituent and the aryl group optionally having a substituent of X, a group selected from groups shown as the alkyl groups optionally having a substituent and the aryl groups optionally having a substituent, respectively, of $R^3$ may be optionally used.

Examples of the alkylsilyl group of X may include a trimethylsilyl group, a triethylsilyl group, and a t-butyldimethylsilyl group.

When the metal compound represented by the formula (1) has two or more X's in one molecule, the X's may be the same as or different from each other. Further, the two or more X's may be bonded to each other to form a ring structure.

In the formula (1), L is a neutral electron donor ligand.

Examples of the neutral electron donor ligand of L may include an electron donor compound containing an atom of the Group 14 or 15 in the periodic table. Specific examples thereof may include phosphines such as trimethylphosphine, triisopropylphosphine, tricyclohexylphosphine, and triphenylphosphine; ethers such as diethyl ether, dibutyl ether, 1,2-dimethoxyethane, and tetrahydrofuran; and amines such as trimethylamine, triethylamine, pyridine, and lutidine. Among these, ethers are preferable. When the metal compound represented by the formula (1) has two or more L's in one molecule, the L's may be the same as or different from each other.

The metal compound represented by the formula (1) is preferably a tungsten compound having a phenylimido group. That is, a metal compound represented by the formula (1) wherein M is a tungsten atom and $R^1$ is a phenyl group is preferable. In particular, a tetrachlorotungsten phenylimide (tetrahydrofuran) complex is more preferable.

The method for producing the metal compound represented by the formula (1) is not particularly limited. For example, as described in Japanese Patent Application Laid-Open No. Hei. 5-345817 A, the metal compound represented by the formula (1) may be produced by mixing an oxyhalogenated product of a Group 6 transition metal; a phenyl isocyanate optionally having a substituent at one or more of the 3-, 4-, and 5-positions or a monosubstituted methyl isocyanate; a neutral electron donor ligand (L); and if necessary, an alcohol, a metal alkoxide, and a metal aryloxide.

In the aforementioned production method, the metal compound represented by the formula (1) is usually obtained in a state where the compound is contained in a reaction liquid. After the production of the metal compound, the aforementioned reaction liquid as it is may be used as a catalyst liquid for the ring-opening polymerization reaction. Alternatively, the metal compound may be isolated from the reaction liquid and purified by a purification treatment such as crystallization, and the resulting metal compound may be used for the ring-opening polymerization reaction.

As the ring-opening polymerization catalyst, the metal compound represented by the formula (1) may be solely used. Alternatively, the metal compound represented by the formula (1) may be used in combination with another component. For example, the metal compound represented by the formula (1) may be used in combination with an organometallic reductant, to improve polymerization activity.

Examples of the organometallic reductant may include organometallic compounds of Groups 1, 2, 12, 13, and 14 in the periodic table, having a hydrocarbon group of 1 to 20 carbon atoms. Examples of such organometallic compounds may include an organolithium such as methyllithium, n-butyllithium, and phenyllithium; an organomagnesium such as butylethylmagnesium, butyloctylmagnesium, dihexylmagnesium, ethylmagnesium chloride, n-butylmagnesium chloride, and allylmagnesium bromide; an organozinc such as dimethylzinc, diethylzinc, and diphenylzinc; an organoaluminum such as trimethylaluminum, triethylaluminum, triisobutylaluminum, diethylaluminum chloride, ethylaluminum sesquichloride, ethylaluminum dichloride, diethylaluminum ethoxide, diisobutylaluminum isobutoxide, ethylaluminum diethoxide, and isobutylaluminum diisobutoxide; and an organotin such as tetramethyltin, tetra(n-butyl)tin, and tetraphenyltin. Among these, an organoaluminum and an organotin are preferable. As the organometallic reductant, one type thereof may be solely used, and two or more types thereof may also be used in combination at any ratio.

The ring-opening polymerization reaction is usually performed in an organic solvent. As the organic solvent, an organic solvent that allows the ring-opening polymer and a hydrogenated product thereof to be dissolved or dispersed under specific conditions and does not inhibit the ring-opening polymerization reaction and a hydrogenation reaction may be used. Examples of such an organic solvent may include aliphatic hydrocarbons such as pentane, hexane, and heptane; alicyclic hydrocarbons such as cyclopentane, cyclohexane, methylcyclohexane, dimethylcyclohexane, trimethylcyclohexane, ethylcyclohexane, diethylcyclohexane, decahydronaphthalene, bicycloheptane, tricyclodecane, hexahydroindene, and cyclooctane; aromatic hydrocarbons such as benzene, toluene, and xylene; halogenated aliphatic hydrocarbons such as dichloromethane, chloroform, and 1,2-dichloroethane; halogenated aromatic hydrocarbons such as chlorobenzene and dichlorobenzene; nitrogen-containing hydrocarbons such as nitromethane, nitrobenzene, and acetonitrile; ethers such as diethyl ether and tetrahydrofuran; and mixed solvents obtained by a combination thereof. Among these, aromatic hydrocarbons, aliphatic hydrocarbons, alicyclic hydrocarbons, and ethers are preferable as the organic solvent. As the organic solvent, one type thereof may be solely used, and two or more types thereof may also be used in combination at any ratio.

The ring-opening polymerization reaction may be initiated, for example, by mixing the cyclic olefin monomer, the metal compound represented by the formula (1), and if necessary, the organometallic reductant. The order of mixing these components is not particularly limited. For example, a solution containing the metal compound represented by the formula (1) and the organometallic reductant may be mixed in a solution containing the cyclic olefin monomer. Alternatively, a solution containing the cyclic olefin monomer and the metal compound represented by the formula (1) may be mixed in a solution containing the organometallic reductant. Further, a solution containing the metal compound represented by the formula (1) may be mixed in a solution containing the cyclic olefin monomer and the organometallic reductant. When the respective components are mixed, the total amount of each of the components may be mixed at once, or the components may be mixed in a plurality of batches. The components may also be continuously mixed over a relatively long period of time (for example, 1 minute or more).

The concentration of the cyclic olefin monomer in the reaction liquid at the time of starting the ring-opening polymerization reaction is preferably 1% by weight or more, more preferably 2% by weight or more, and particularly preferably 3% by weight or more, and is preferably 50% by weight or less, more preferably 45% by weight or less, and particularly preferably 40% by weight or less. When the concentration of the cyclic olefin monomer is equal to or more than the lower limit value of the aforementioned range, productivity can be enhanced. When the concentration thereof is equal to or less than the upper limit value, viscosity of the reaction liquid after the ring-opening polymerization reaction can be decreased. Consequently, the subsequent hydrogenation reaction can be facilitated.

The amount of the metal compound represented by the formula (1) used in the ring-opening polymerization reaction is desirably set so that the molar ratio of "metal compound: cyclic olefin monomer" falls within a specific range. Specifically, the aforementioned molar ratio is preferably 1:100 to 1:2,000,000, more preferably 1:500 to 1,000,000, and particularly preferably 1:1,000 to 1:500,000. When the amount of the metal compound is equal to or more than the lower limit value of the aforementioned range, sufficient polymerization activity can be obtained. When the amount thereof is equal to or less than the upper limit value, the metal compound can be easily removed after the reaction.

The amount of the organometallic reductant is preferably 0.1 mol or more, more preferably 0.2 mol or more, and particularly preferably 0.5 mol or more, and is preferably 100 mol or less, more preferably 50 mol or less, and particularly preferably 20 mol or less, relative to 1 mol of the metal compound represented by the formula (1). When the amount of the organometallic reductant is equal to or more than the lower limit value of the aforementioned range, polymerization activity can be sufficiently enhanced. When the amount thereof is equal to or less than the upper limit value, occurrence of a side reaction can be suppressed.

The polymerization reaction system of the polymer ($\alpha$) may contain an activity adjuster. When the activity adjuster is used, the ring-opening polymerization catalyst can be stabilized, the reaction speed of the ring-opening polymerization reaction can be adjusted, and the molecular weight distribution of the polymer can be adjusted.

As the activity adjuster, an organic compound having a functional group may be used. Examples of the activity adjuster may include an oxygen-containing compound, a nitrogen-containing compound, and a phosphorus-containing organic compound.

Examples of the oxygen-containing compound may include: ethers such as diethyl ether, diisopropyl ether, dibutyl ether, anisole, furan, and tetrahydrofuran; ketones such as acetone, benzophenone, and cyclohexanone; and esters such as ethyl acetate.

Examples of the nitrogen-containing compound may include: nitriles such as acetonitrile and benzonitrile; amines such as triethylamine, triisopropylamine, quinuclidine, and N,N-diethylaniline; and pyridines such as pyridine, 2,4-lutidine, 2,6-lutidine, and 2-t-butylpyridine.

Examples of the phosphorous-containing compound may include: phosphines such as triphenyl phosphine, tricyclohexyl phosphine, triphenyl phosphate, and trimethyl phosphate; and phosphine oxides such as triphenyl phosphine oxide.

As the activity adjuster, one type thereof may be solely used, and two or more types thereof may also be used in combination at any ratio.

The amount of the activity adjuster in the polymerization reaction system of the polymer ($\alpha$) is preferably 0.01 mol % to 100 mol % relative to 100 mol % of the metal compound represented by the formula (1).

In order to adjust the molecular weight of the polymer ($\alpha$), the polymerization reaction system of the polymer ($\alpha$) may contain a molecular weight adjuster. Examples of the molecular weight adjuster may include: $\alpha$-olefins such as 1-butene, 1-pentene, 1-hexene, and 1-octene; aromatic vinyl compounds such as styrene and vinyltoluene; an oxygen-containing vinyl compound such as ethyl vinyl ether, isobutyl vinyl ether, allyl glycidyl ether, allyl acetate, allyl alcohol, and glycidyl methacrylate; a halogen-containing vinyl compound such as allyl chloride; a nitrogen-containing vinyl compound such as acrylamide; non-conjugated dienes such as 1,4-pentadiene, 1,4-hexadiene, 1,5-hexadiene, 1,6-heptadiene, 2-methyl-1,4-pentadiene, and 2,5-dimethyl-1,5-hexadiene; and conjugated dienes such as 1,3-butadiene, 2-methyl-1,3-butadiene, 2,3-dimethyl-1,3-butadiene, 1,3-pentadiene, and 1,3-hexadiene.

As the molecular weight adjuster, one type thereof may be solely used, and two or more types thereof may also be used in combination at any ratio.

The amount of the molecular weight adjuster in the polymerization reaction system for polymerizing the polymer ($\alpha$) may be appropriately determined depending on an intended molecular weight. The specific amount of the molecular weight adjuster is preferably in a range of 0.1 mol % to 50 mol % relative to the cyclic olefin monomer.

The polymerization temperature is preferably −78° C. or higher, and more preferably −30° C. or higher, and is preferably +200° C. or lower, and more preferably +180° C. or lower.

The polymerization time may be dependent on reaction scale. The specific polymerization time is preferably in a range of 1 minute to 1,000 hours.

By the aforementioned production method, the polymer (α) may be obtained. By hydrogenating this polymer (α), the polymer (β) may be produced.

For example, hydrogenation of the polymer (α) may be performed by supplying hydrogen into the reaction system containing the polymer (α) in the presence of a hydrogenation catalyst in accordance with an ordinary method. When reaction conditions in this hydrogenation reaction are appropriately set, the tacticity of the hydrogenated product is not usually altered by the hydrogenation reaction.

As the hydrogenation catalyst, a homogeneous catalyst or a heterogeneous catalyst that is publicly known as a hydrogenation catalyst for an olefin compound may be used.

Examples of the homogeneous catalyst may include a catalyst including a combination of a transition metal compound and an alkali metal compound such as cobalt acetate/triethylaluminum, nickel acetylacetonate/triisobutylaluminum, titanocene dichloride/n-butyllithium, zirconocene dichloride/sec-butyllithium, and tetrabutoxy titanate/dimethylmagnesium; and a noble metal complex catalyst such as dichlorobis(triphenylphosphine)palladium, chlorohydridecarbonyltris(triphenylphosphine)ruthenium, chlorohydridecarbonylbis(tricyclohexylphosphine)ruthenium, bis(tricyclohexylphosphine)benzylidyne ruthenium (IV) dichloride, and chlorotris(triphenylphosphine)rhodium.

Examples of the heterogeneous catalyst may include a metal catalyst such as nickel, palladium, platinum, rhodium, and ruthenium; and a solid catalyst in which the aforementioned metal is supported on a carrier such as carbon, silica, diatomaceous earth, alumina, or titanium oxide such as nickel/silica, nickel/diatomaceous earth, nickel/alumina, palladium/carbon, palladium/silica, palladium/diatomaceous earth, and palladium/alumina.

As the hydrogenation catalyst, one type thereof may be solely used, and two or more types thereof may also be used in combination at any ratio.

The hydrogenation reaction is usually performed in an inert organic solvent. Examples of the inert organic solvent may include: aromatic hydrocarbons such as benzene and toluene; aliphatic hydrocarbons such as pentane and hexane; alicyclic hydrocarbons such as cyclohexane and decahydronaphthalene; and ethers such as tetrahydrofuran and ethylene glycol dimethyl ether. As the inert organic solvent, one type thereof may be solely used, and two or more types thereof may also be used in combination at any ratio. The inert organic solvent may be the same as or different from the organic solvent used in the ring-opening polymerization reaction. Furthermore, the hydrogenation catalyst may be mixed in the reaction liquid of the ring-opening polymerization reaction for performing the hydrogenation reaction.

The reaction conditions for the hydrogenation reaction usually vary depending on the hydrogenation catalyst used.

The reaction temperature of the hydrogenation reaction is preferably −20° C. or higher, more preferably −10° C. or higher, and particularly preferably 0° C. or higher, and is preferably +250° C. or lower, more preferably +220° C. or lower, and particularly preferably +200° C. or lower. When the reaction temperature is equal to or higher than the lower limit value of the aforementioned range, reaction speed can be increased. When the reaction temperature is equal to or lower than the upper limit value, occurrence of a side reaction can be suppressed.

The hydrogen pressure is preferably 0.01 MPa or more, more preferably 0.05 MPa or more, and particularly preferably 0.1 MPa or more, and is preferably 20 MPa or less, more preferably 15 MPa or less, and particularly preferably 10 MPa or less. When the hydrogen pressure is equal to or more than the lower limit value of the aforementioned range, the reaction speed can be increased. When the hydrogen pressure is equal to or less than the upper limit value, a special apparatus such as a high pressure resistant reaction apparatus is not required, and thereby facility costs can be reduced.

The reaction time of the hydrogenation reaction may be set to any time period during which a desired hydrogenation rate is achieved, and preferably 0.1 hour to 10 hours.

After the hydrogenation reaction, the polymer (β), which is the hydrogenated product of the polymer (α), is collected usually in accordance with an ordinary method.

The hydrogenation rate (the ratio of the hydrogenated main-chain double bond) in the hydrogenation reaction is preferably 98% or more, and more preferably 99% or more. As the hydrogenation rate becomes higher, bend resistance of the alicyclic structure-containing polymer can be made more favorable.

Herein, the hydrogenation rate of the polymer may be measured by a $^1$H-NMR measurement at 145° C. with o-dichlorobenzene-$d^4$ as a solvent.

Subsequently, the methods for producing the polymer (γ) and the polymer (δ) will be described.

The cyclic olefin monomer to be used for producing the polymer (γ) and the polymer (δ) may be optionally selected from the range shown as the cyclic olefin monomers to be used for producing the polymer (α) and the polymer (β). As the cyclic olefin monomer, one type thereof may be solely used, and two or more types thereof may also be used in combination at any ratio.

In the production of the polymer (γ), an optional monomer which is copolymerizable with a cyclic olefin monomer may be used as a monomer in combination with the cyclic olefin monomer. Examples of the optional monomer may include: α-olefins of 2 to 20 carbon atoms such as ethylene, propylene, 1-butene, 1-pentene, and 1-hexene; an aromatic ring vinyl compound such as styrene and α-methylstyrene; and non-conjugated dienes such as 1,4-hexadiene, 4-methyl-1,4-hexadiene, 5-methyl-1,4-hexadiene, and 1,7-octadiene. Among these, an α-olefin is preferable, and ethylene is more preferable. As the optional monomer, one type thereof may be solely used, and two or more types thereof may also be used in combination at any ratio.

The ratio between the cyclic olefin monomer and the optional monomer in terms of a weight ratio (cyclic olefin monomer:optional monomer) is preferably 30:70 to 99:1, more preferably 50:50 to 97:3, and particularly preferably 70:30 to 95:5.

When two or more types of the cyclic olefin monomers are used, or when the cyclic olefin monomer and the optional monomer are used in combination, the polymer (γ) may be a block copolymer, or a random copolymer.

For the synthesis of the polymer (γ), an addition polymerization catalyst is usually used. Examples of the addition polymerization catalyst may include a vanadium-based catalyst formed from a vanadium compound and an organoaluminum compound, a titanium-based catalyst formed from a titanium compound and an organoaluminum compound, and a zirconium-based catalyst formed from a zirconium complex and aluminoxane. As the addition polymerization catalyst, one type thereof may be solely used, and two or more types thereof may also be used in combination at any ratio.

The amount of the addition polymerization catalyst is preferably 0.000001 mol or more, and more preferably 0.00001 mol or more, and is preferably 0.1 mol or less, and more preferably 0.01 mol or less, relative to 1 mol of a monomer.

The addition polymerization of the cyclic olefin monomer is usually performed in an organic solvent. The organic solvent may be optionally selected from the range shown as the organic solvents to be used for the ring-opening polymerization of a cyclic olefin monomer. As the organic solvent, one type thereof may be solely used, and two or more types thereof may also be used in combination at any ratio.

The polymerization temperature in the polymerization for producing the polymer (γ) is preferably −50° C. or higher, more preferably −30° C. or higher, and particularly preferably −20° C. or higher, and is preferably 250° C. or lower, more preferably 200° C. or lower, and particularly preferably 150° C. or lower. The polymerization time is preferably 30 minutes or more, and more preferably 1 hour or more, and is preferably 20 hours or less, and more preferably 10 hours or less.

By the aforementioned production method, the polymer (γ) may be obtained. By hydrogenating this polymer (γ), the polymer (δ) may be produced.

The hydrogenation of the polymer (γ) may be performed by the same method as the method previously described as the method for hydrogenating the polymer (α).

In the crystallizable resin, the ratio of the alicyclic structure-containing polymer having crystallizability is preferably 50% by weight or more, more preferably 70% by weight or more, and particularly preferably 90% by weight or more. When the ratio of the alicyclic structure-containing polymer having crystallizability is equal to or more than the lower limit value of the aforementioned range, bend resistance of the substrate film can be enhanced.

The crystallizable resin may contain an optional component in addition to the alicyclic structure-containing polymer having crystallizability. Examples of the optional components may include an antioxidant such as a phenol-based antioxidant, a phosphorus-based antioxidant, and a sulfur-based antioxidant; a light stabilizer such as a hindered amine-based light stabilizer; a wax such as a petroleum-based wax, a Fischer-Tropsch wax, and a polyalkylene wax; a nucleating agent such as a sorbitol-based compound, a metal salt of an organic phosphoric acid, a metal salt of an organic carboxylic acid, kaolin, and talc; a fluorescent brightener such as a diaminostilbene derivative, a coumarin derivative, an azole-based derivative (for example, a benzoxazole derivative, a benzotriazole derivative, a benzimidazole derivative, and a benzothiazole derivative), a carbazole derivative, a pyridine derivative, a naphthalic acid derivative, and an imidazolone derivative; an ultraviolet absorber such as a benzophenone-based ultraviolet absorber, a salicylic acid-based ultraviolet absorber, a benzotriazole-based ultraviolet absorber; an inorganic filler such as talc, silica, calcium carbonate, and glass fiber; a colorant; a flame retardant; a flame retardant auxiliary; an antistatic agent; a plasticizer; a near-infrared absorber; a lubricant; a filler, and an optional polymer other than the alicyclic structure-containing polymer having crystallizability such as a soft polymer. As the optional component, one type thereof may be solely used, and two or more types thereof may also be used in combination at any ratio.

[2.2. Properties, Shape, and the like of Substrate Film]

The alicyclic structure-containing polymer contained in the crystallizable resin may not be crystallized prior to production of the substrate film. However, after production of the substrate film, the alicyclic structure-containing polymer contained in the crystallizable resin for forming the substrate film may have a specific crystallization degree.

The crystallization degree of the alicyclic structure-containing polymer having crystallizability in the substrate film is 30% or more, preferably 50% or more, and more preferably 60% or more. According to the finding by the inventor, by combining a substrate film containing an alicyclic structure-containing polymer having such a high crystallization degree with an organic electroconductive layer, an electroconductive film having excellent bend resistance can be obtained. The upper limit of the crystallization degree is ideally 100%, and may be usually 90% or less or 80% or less.

The crystallization degree is an index showing a ratio of crystallized alicyclic structure-containing polymer relative to the alicyclic structure-containing polymer having crystallizability contained in the substrate film. The crystallization degree of the alicyclic structure-containing polymer contained in the substrate film may be measured by an X-ray diffraction method. Specifically, the X-ray diffraction intensity from a crystallizable area may be determined by a wide-angle X-ray diffractometer (e.g., RINT 2000 manufactured by Rigaku Corporation) in accordance with JIS K0131, and the crystallization degree may be determined from a ratio of the X-ray diffraction intensity relative to the overall X-ray diffraction intensity by the following expression (2).

$$Xc = K \cdot Ic/It \quad (2)$$

In the expression (2), "Xc" is the crystallization degree of a sample to be tested, "Ic" is the X-ray diffraction intensity from the crystallizable area, "It" is the overall X-ray diffraction intensity, and "K" is a correction factor.

The substrate film is preferably excellent in transparency. Specifically, the total light transmittance of the substrate film is preferably 80% or more, more preferably 85% or more, and particularly preferably 88% or more.

The total light transmittance of the substrate film may be measured in the wavelength range of 400 nm to 700 nm using an ultraviolet-visible spectrometer.

The substrate film preferably has a small haze. Specifically, the haze of the substrate film is preferably 5% or less, more preferably 3% or less, and particularly preferably 1% or less.

The haze of the substrate film may be determined by cutting the substrate film into a square thin film sample of 50 mm×50 mm at an randomly selected portion of the substrate film, and measuring haze of the thin film sample using a haze meter.

The substrate film may be a substantially optically isotropic film having a small in-plane retardation Re, or an optically anisotropic film having an in-plane retardation Re. When the electroconductive film of the present invention is used as a component of an on-cell type or a mid-cell type touch panel, it is preferable that the substrate film is a film having a low birefringence. In this case, the upper limit value of Re is preferably 20 nm or less, and more preferably 10 nm or less, and the lower limit value of Re is ideally 0 nm.

The thickness of the substrate film is 5 μm or more, and preferably 10 μm or more, and is 50 μm or less, and preferably 30 μm or less. According to the finding by the inventor, in the case where the above-mentioned specific material is used as the material of the substrate film and the organic electroconductive layer is used as the electroconductive layer, by setting the thickness of the substrate film within such a specific range, bend resistance of the electro-conductive film can be enhanced.

[2.3. Method for Producing Substrate Film]

The substrate film may be produced by a production method including, for example, a step of obtaining a crystallized film by bringing a primary film formed of a crystallizable resin containing an alicyclic structure-containing polymer having crystallizability to a specific temperature while the primary film is in a strained state (crystallization step). Such straining of the primary film may be achieved by holding at least two edges of the primary film. The specific temperature may be a temperature equal to or higher than the glass transition temperature Tg of the alicyclic structure-containing polymer and equal to or lower than the melting point Tm of the alicyclic structure-containing polymer. According to this production method, a substrate film having a specific crystallization degree, which can be used in the present invention, can be easily produced. Hereinafter, this production method will be described.

[2.3.1. Preparation of Primary Film]

In the above-mentioned production method, a step of preparing a primary film is performed. The primary film is a film formed of a crystallizable resin. The primary film may be produced by, for example, a resin molding method such as an injection molding method, an extrusion molding method, a press molding method, an inflation molding method, a blow molding method, a calendar molding method, a cast molding method, or a compression molding method. Among these, it is preferable to produce a primary film by an extrusion molding method because the thickness thereof can be easily controlled.

When the primary film is produced by the extrusion molding method, the production conditions in the extrusion molding method are preferably as follows. The cylinder temperature (molten resin temperature) is preferably Tm or higher, and more preferably Tm+20° C. or higher, and is preferably Tm+100° C. or lower, and more preferably Tm+50° C. or lower. The temperature of a cast roll is preferably Tg−50° C. or higher, and is preferably Tg+70° C. or lower, and more preferably Tg+40° C. or lower. In addition, the temperature of a cooling roll is preferably Tg−70° C. or higher, and more preferably Tg−50° C. or higher, and is preferably Tg+60° C. or lower, and more preferably Tg+30° C. or lower. When the primary film is produced under such conditions, the primary film having a thickness of 1 μm to 1 mm can be easily obtained. Herein, "Tm" represents the melting point of the alicyclic structure-containing polymer, and "Tg" represents the glass transition temperature of the alicyclic structure-containing polymer.

The primary film produced as described above may be supplied as it is to the crystallization step, or may be supplied to the crystallization step after being subjected to an optional treatment such as a stretching treatment, for example.

The method for stretching the primary film is not particularly limited, and any stretching method may be adopted. Examples thereof may include a uniaxial stretching method such as a method of uniaxially stretching the primary film in a lengthwise direction (longitudinal uniaxial stretching method) and a method of uniaxially stretching the primary film in a width direction (transversal uniaxial stretching method); a biaxial stretching method such as a simultaneous biaxial stretching method of stretching the primary film in the width direction at the same time as stretching the primary film in the lengthwise direction, and a sequential biaxial stretching of stretching the primary film in one of the lengthwise direction and the width direction, followed by stretching the primary film in the other direction; and a method of stretching the primary film in an oblique direction that is neither parallel nor perpendicular to the width direction (oblique stretching method).

Examples of the longitudinal uniaxial stretching method may include a stretching method utilizing a difference in a peripheral speed between rolls.

Examples of the transversal uniaxial stretching method may include a stretching method using a tenter stretching machine.

Examples of the simultaneous biaxial stretching method may include a stretching method in which the primary film is stretched in the lengthwise direction and simultaneously stretched in the width direction using a tenter stretching machine. As the tenter stretching machine, those provided with a plurality of clips that are movable along guide rails may be used. Such clips may fix the primary film in the tenter stretching machine. In such a tenter stretching machine, the primary film may be stretched in the lengthwise direction by increasing intervals between the clips, and simultaneously stretched in the width direction using a spreading angle of the guide rails.

Examples of the sequential biaxial stretching method may include a stretching method in which the primary film is stretched in the lengthwise direction using a difference in a peripheral speed between rolls, both ends of the primary film are then gripped by clips, and the primary film is stretched in the width direction by a tenter stretching machine.

Examples of the oblique stretching method may include a stretching method in which the primary film is continuously stretched in the oblique direction using a tenter stretching machine that is capable of applying a feeding force, a pulling force, or a drawing force to the primary film at different speeds on left and right sides in the lengthwise or width direction.

The stretching temperature during stretching of the primary film is preferably Tg−30° C. or higher, and more preferably Tg−10° C. or higher, and is preferably Tg+60° C. or lower, and more preferably Tg+50° C. or lower, relative to the glass transition temperature Tg of the alicyclic structure-containing polymer. By performing the stretching in such a temperature range, the polymer molecules contained in the primary film can be appropriately oriented.

The stretching ratio in the case of stretching the primary film may be appropriately selected in accordance with desired optical properties, thickness, strength, and the like, and is usually more than 1 time, and preferably 1.01 times or more, and is usually 10 times or less, and preferably 5 times or less. Herein, for example, when the stretching is performed in a plurality of different directions such as in the case of the biaxial stretching method, the stretching ratio refers to the total stretching ratio that is represented by product of stretching ratios in the respective stretching directions. When the stretching ratio is equal to or less than the upper limit value of the aforementioned range, a possibility of breakage of the film can be reduced, whereby the production of the substrate film can be facilitated.

By subjecting the primary film to the above-mentioned stretching treatment, a substrate film having desired properties can be obtained.

The thickness of the primary film may be optionally set in accordance with the thickness of the substrate film, and is usually 5 μm or more, and preferably 10 μm or more, and is usually 1 mm or less, and preferably 500 μm or less.

[2.3.2. Crystallization Step]

After the primary film is prepared, the crystallization step is performed to crystallize the alicyclic structure-containing polymer contained in the primary film. In the crystallization step, a crystallization treatment for crystallizing the alicyclic structure-containing polymer is performed by holding the primary film in a strained state with at least two edges thereof being held while the temperature is set within a specific temperature range.

The strained state of the primary film means a state where a tension is applied to the primary film. However, this strained state of the primary film does not include a state where the primary film is substantially stretched. Substantially stretched means that the stretching ratio of the primary film in any direction is usually 1.1 times or more.

When the primary film is held, appropriate holders are used for holding. The holders may be holders capable of continuously holding the primary film over the entire length of edges thereof. Alternatively, the holders may be holders capable of intermittently holding the primary film at intervals. For example, the edges of the primary film may be intermittently held by holders disposed at specific intervals.

In the crystallization step, the primary film is kept in a strained state with at least two edges of the primary film being held. Thus, deformation due to thermal shrinkage of the primary film in an area between the held edges is prevented. In order to prevent deformation in a wide area of the primary film, it is preferable that edges including two opposing edges are held to keep the area between the held edges in a strained state. For example, as to a primary film in a rectangular sheet piece shape, two opposing edges (e.g., edges on long sides or short sides) may be held to keep the area between the two edges in a strained state. Thereby deformation over the entire surface of the primary film in the sheet piece shape can be prevented. As to a long-length primary film, two edges at ends of the primary film in the width direction (i.e., edges on long sides) may be held to keep the area between the two edges in a strained state. Thereby deformation over the entire surface of the long-length primary film can be prevented. In the primary film whose deformation is prevented in this manner, even when a stress due to thermal shrinkage is generated, occurrence of deformation such as wrinkle is suppressed. When a stretched film that has been subjected to a stretching treatment is used as the primary film, by holding at least two edges that are orthogonal to the stretching direction (in a case of biaxial stretching, the direction in which the stretching ratio is larger), deformation is more surely suppressed.

In order to more surely suppress the deformation in the crystallization step, it is preferable that a larger number of edges are held. For example, in the primary film in the sheet piece shape, it is preferable that all edges are held. Specifically, as to the rectangular sheet piece shape, it is preferable that four edges of the primary film are held.

As a holder capable of holding an edge of the primary film, a holder that does not come into contact with the primary film in an area other than the edge of the primary film is preferable. When such a holder is used, a substrate film having more excellent smoothness can be obtained.

As the holder, a holder that can fix a position relative to another holder in the crystallization step is preferable. When such holders are used, the positions of the holders do not relatively shift in the crystallization step. Therefore, substantial stretching of the primary film in the crystallization step can be easily suppressed.

Suitable examples of the holders may include grippers such as clips that are provided in a frame at specific intervals as holders for a rectangular primary film and can grip the edges of the primary film. Examples of holders for holding two edges at ends of the long-length primary film in the width direction may include grippers that are provided to a tenter stretching machine and are capable of gripping the edges of the primary film.

When the long-length primary film is used, edges at ends of the primary film in the lengthwise direction (that is, edges on short sides) may be held. However, both sides in the lengthwise direction of an area of the primary film that is subjected to the crystallization treatment may be held without holding the aforementioned edges. For example, on the both sides in the lengthwise direction of the area of the primary film that is subjected to the crystallization treatment, a holding device that is capable of holding the primary film so that the primary film is not thermally shrunk, to keep the primary film in a strained state may be provided. Examples of the holding device may include a combination of two rolls and a combination of an extruder and a take-up roll. When a tension such as a conveyance tension is applied to the primary film by these combinations, thermal shrinkage of the primary film in the area that is subjected to the crystallization treatment can be suppressed. Therefore, when the aforementioned combination is used as the holding device, the primary film can be held while the primary film is conveyed in the lengthwise direction. Accordingly, the substrate film can be efficiently produced.

In the crystallization step, the temperature of the primary film is adjusted to a temperature that is equal to or higher than the glass transition temperature Tg of the alicyclic structure-containing polymer and equal to or lower than the melting point Tm of the alicyclic structure-containing polymer while the primary film is kept in the strained state with at least two edges of the primary film are held as described above. In the primary film of which the temperature is adjusted to the aforementioned temperature, crystallization of the alicyclic structure-containing polymer proceeds. Therefore, as a result of this crystallization step, a crystallized film containing a crystallized alicyclic structure-containing polymer is obtained. In this step, the crystallized film is kept in the strained state while deformation of the crystallized film is prevented. Therefore, the crystallization can be advanced without impairing the smoothness of the crystallized film.

The temperature range in the crystallization step may be optionally set within a temperature range that is equal to or higher than the glass transition temperature Tg of the alicyclic structure-containing polymer and equal to or lower than the melting point Tm of the alicyclic structure-containing polymer, as described above. In particular, it is preferable that the temperature is set to a temperature at which the crystallization proceeds at a fast speed. The temperature of the primary film in the crystallization step is preferably Tg+20° C. or higher, and more preferably Tg+30° C. or higher, and is preferably Tm−20° C. or lower, and more preferably Tm−40° C. or lower. When the temperature in the crystallization step is equal to or lower than the upper limit of the aforementioned range, clouding of the substrate film can be suppressed. Therefore, a substrate film suitable for a case where an optically transparent film is required is obtained.

When the temperature of the primary film is set to the temperature described above, heating of the primary film is usually performed. It is preferable that a heating device used for this heating is a heating device that can increase the atmospheric temperature of the primary film. This is because contact of the heating device with the primary film is unnecessary. Specific examples of the suitable heating device may include an oven and a heating furnace.

The treatment time of maintaining the temperature of the primary film within the aforementioned temperature range in the crystallization step is preferably 1 second or more, and more preferably 5 seconds or more, and is preferably 30 minutes or less, and more preferably 10 minutes or less. When the crystallization of the alicyclic structure-containing polymer is sufficiently advanced in the crystallization step, bend resistance of the substrate film can be enhanced. When the treatment time is equal to or lower than the upper limit of the aforementioned range, clouding of the substrate film can be suppressed. Therefore, a substrate film suitable for a case where an optically transparent film is required is obtained.

[2.3.3. Optional Step]

In the method for producing a substrate film, an optional step may be further performed in combination with the crystallization step described above. Examples of the optional step may include a relaxation step of causing thermal shrinking of the crystallized film to remove a residual stress after the crystallization step; and a surface treatment of the obtained substrate film.

[3. Organic Electroconductive Layer]

The organic electroconductive layer is a layer containing an organic electroconductive material. As the organic electroconductive material, an organic material having both transparency and electroconductivity may be used as appropriate. Preferable examples of the organic electroconductive material may include polythiophene, polypyrrole, polyaniline, and polyquinoxaline. Among these, polythiophene and polyaniline having good electroconductivity and optical properties are preferable, and polythiophene is particularly preferable.

The polythiophene is a polymer containing a polymerization unit having a structure obtained by polymerizing thiophene or a derivative thereof (hereinafter, sometimes referred to as a "thiophene unit"). Examples of derivatives of thiophene may include derivatives having substituents at 3- and 4-positions of the thiophene ring. More specific examples thereof may include 3,4-ethylenedioxythiophene. Polymers of such ethylenedioxythiophene, i.e. polyethylenedioxythiophene, may be used particularly preferably in the present invention.

Examples of polymerization mode of thiophene or a derivative thereof in polythiophene typically include those in which the thiophene ring is bonded to other rings at 2- and 5-positions of the thiophene ring, and more specifically, a mode in which ethylenedioxythiophene is bonded to other rings at 2- and 5-positions of the thiophene ring.

Polythiophene may have a polymerization unit other than the thiophene unit.

The molecular weight of the polythiophene is not particularly limited, and polythiophene having a molecular weight which can exert a desired electroconductivity can be appropriately selected.

The polythiophene may preferably be used in combination with a polystyrene sulfonic acid compound. The polystyrene sulfonic acid compound is a polymer containing a polymerization unit having a structure obtained by polymerizing a styrene sulfonic acid or a derivative thereof (hereinafter, sometimes referred to as a "styrene sulfonic acid unit").

The polystyrene sulfonic acid compound may have a polymerization unit other than the styrene sulfonic acid unit.

The ratio of an electroconductive polymer in the organic electroconductive layer and the ratio of the polythiophene and the polystyrene sulfonic acid compound in the electroconductive polymer may be appropriately adjusted so as to obtain properties such as desired electroconductivity. As the polythiophene or a mixture of the polythiophene with the polystyrene sulfonic acid compound, a commercially available product may be used. Examples of the commercially available product may include "Clevios (registered trademark) PH500, PH510, and PH1000" available from Heraeus, and "Orgacon S-300" available from Agfa-Gevaert Japan., Ltd.

Formation of the organic electroconductive layer on the substrate film may be performed in accordance with an ordinary method. For example, a composition containing a component of the organic electroconductive layer described above, and optionally containing another component such as a solvent is applied onto a surface of the substrate film, to form a layer of the composition, and the layer is dried, to obtain the organic electroconductive layer. Before such applying, the surface of the substrate film may be subjected to a surface treatment such as a corona treatment.

The electroconductive film of the present invention may have the organic electroconductive layer on only one surface or both surfaces of the substrate film. The organic electroconductive layer may be a single layer, or two or more organic electroconductive layers may be overlaid. Regardless of a single layer or a multilayer, the entire thickness of the organic electroconductive layer on one surface of the substrate film is usually 10 nm or more, and preferably 50 nm or more, and is usually 3000 nm or less, and preferably 1000 nm or less. When the thickness of the organic electroconductive layer is increased, the surface resistance can be generally decreased. On the other hand, when the thickness of the organic electroconductive layer is equal to or less than the upper limit of the aforementioned range, favorable bend resistance can be obtained.

[4. Optional Layer]

The aforementioned electroconductive film may include an optional layer such as an optical functional layer and a barrier layer in combination with the substrate film and the electroconductive layer.

[5. Properties of Electroconductive Film]

The electroconductive film of the present invention may have a function of an electrode by having the organic electroconductive layer. The surface resistivity of surface of the electroconductive film of the present invention on the organic electroconductive layer side may be appropriately selected depending on the purpose of use, and is usually 1000 Ω/sq or less, and preferably 500 Ω/sq or less. The surface resistivity may be measured by a four-terminal four-probe method using Loresta HP (manufactured by Dia Instruments Co., Ltd.) or Loresta MP MCP-T350 (manufactured by Dia Instruments Co., Ltd.).

The electroconductive film of the present invention may have high bend resistance. The bend resistance of the electroconductive film refers to a property capable of maintaining electroconductivity even after the electroconductive film is repeatedly bent. The bend resistance may be evaluated by repeatedly bending the electroconductive film by a tester for evaluating bending durability, and comparing the surface resistivity before bending to that after bending. The bending of the electroconductive film may be performed by, for example, a method for a tension-free planar body U-shape folding test using a desktop model endurance test machine (DLDMLH-FS) manufactured by Yuasa System Co., Ltd. The bend resistance may be evaluated by measuring the surface resistivity R0 before bending and the surface resistivity R1 after bending, and calculating the surface resistivity change ratio $\Delta R$ by Expression $\Delta R=((R1-R0)/R0)\times 100$.

[6. Applications]

The electroconductive film of the present invention may be used for any application. Examples of the application may include a flexible electrode of an organic EL element and a solar cell, and a component for a touch panel. In particular, the electroconductive film may be usefully used as a component for a touch panel by taking advantage of such high bend resistance.

[7. Method for Producing Electroconductive Film]

The electroconductive film of the present invention may be produced by a method for producing an electroconductive film including:

(i) a step of preparing the primary film formed of the resin containing the alicyclic structure-containing polymer having crystallizability;

(ii) a step of obtaining the substrate film from the primary film; and (iii) a step of forming the organic electroconductive layer on the substrate film.

The steps (i) to (iii) may be performed by the aforementioned methods. In particular, it is preferable that the step (ii) is a process including a step of stretching the primary film and a crystallization step of crystallizing the alicyclic structure-containing polymer contained in the primary film. It is preferable that the crystallization step in the step (ii) is performed at a temperature that is equal to or higher than the glass transition temperature Tg of the alicyclic structure-containing polymer and equal to or lower than the melting point Tm of the alicyclic structure-containing polymer in the strained state with at least two edges of the primary film are held. By adopting the production method including such a crystallization step, an electroconductive film having desired high bend resistance can be particularly easily produced.

EXAMPLES

Hereinafter, the present invention will be specifically described by illustrating Examples. However, the present invention is not limited to the Examples described below. The present invention may be optionally modified for implementation without departing from the scope of claims of the present invention and its equivalents.

In the following description, "%" and "part" representing quantity are on the basis of weight, unless otherwise specified. The operations described below were performed under the conditions of normal temperature and normal pressure, unless otherwise specified. In the following description, "sccm" is a unit of flow rate of a gas indicating the amount of the gas flowing per minute represented by the volume ($cm^3$) of the gas at 25° C. and 1 atm.

[Evaluation Method]

[Weight-Average Molecular Weight and Number-Average Molecular Weight]

The weight-average molecular weight and number-average molecular weight of the polymer were measured as a polystyrene-equivalent value by a gel permeation chromatography (GPC) system ("HLC-8320" manufactured by Tosoh Corporation). In the measurement, an H-type column (manufactured by Tosoh Corporation) was used as a column, and tetrahydrofuran was used as a solvent. In the measurement, the temperature was 40° C.

[Glass Transition Temperature Tg and Melting Point Tm]

A sample heated to 300° C. in a nitrogen atmosphere was quenched by liquid nitrogen, and the glass transition temperature Tg and melting point Tm of the sample were each determined by increasing the temperature at 10° C./min using a differential scanning calorimeter (DSC).

[Method for Measuring Hydrogenation Ratio of Polymer]

The hydrogenation ratio of the polymer was measured by $^1$H-NMR measurement at 145° C. using o-dichlorobenzene-$d^4$ as a solvent.

[Ratio of Racemo Diad of Polymer]

The $^{13}$C-NMR measurement of a polymer was performed at 200° C. with ortho-dichlorobenzene-$d^4$ as a solvent by an inverse-gated decoupling method. From the result of the $^{13}$C-NMR measurement, a signal at 43.35 ppm attributed to the meso diad and a signal at 43.43 ppm attributed to the racemo diad were identified with the peak at 127.5 ppm of ortho-dichlorobenzene-$d^4$ as a reference shift. On the basis of the intensity ratio of these signals, the ratio of the racemo diad of the polymer was determined.

[Crystallization Degree]

The crystallization degree was confirmed by X-ray diffraction in accordance with JIS K0131. Specifically, the X-ray diffraction intensity from the crystallized area was determined by a wide-angle X-ray diffractometer (RINT 2000 manufactured by Rigaku Corporation), and the crystallization degree was determined from a ratio of the X-ray diffraction intensity relative to the overall X-ray diffraction intensity by the following expression (2).

$$Xc = K \cdot Ic/It \quad (2)$$

In the expression (2), "Xc" is the crystallization degree of the tested sample, "Ic" is the X-ray diffraction intensity from the crystallizable area, "It" is the overall X-ray diffraction intensity, and "K" is a correction factor.

[Measurement of Front Surface Retardation Re of Film]

The front surface retardation Re of the film was measured at a wavelength of 590 nm by a polarimeter ("AxoScan" manufactured by Axometrix).

[Bend Resistance]

The electroconductive film obtained in each of Examples and Comparative Examples was bent, and the surface resistivity before bending was compared to that after bending to thereby evaluate the bend resistance of the electroconductive film. Bending of the electroconductive film was performed by a method for a tension-free planar body U-shape folding test using a desktop model endurance test machine (DLD-MLH-FS) manufactured by Yuasa System Co., Ltd. The conditions of bending were a bending radius of 1 mm, a rate of expansion-contraction of 80 cycles/minute, and a number of expansion-contraction of 100,000. The surface resistivity R0 before bending and the surface resistivity R1 after bending were measured. The surface resistivity change ratio ΔR was calculated by Expression $\Delta R = ((R1 \times R0)/R0) \times 100$. It is preferable that the surface resistivity change ratio ΔR is small. A case where the surface resistivity change ratio ΔR was less than 2% was evaluated as "A". A case where the surface resistivity change ratio ΔR was 2% or more and less than 5% was evaluated as "B". A case where the surface resistivity change ratio ΔR was 5% or more was evaluated as "C".

[Surface Resistivity]

The surface resistivity of the electroconductive film was measured by a four-terminal four-probe method using Loresta HP (manufactured by Dia Instruments Co., Ltd.) or Loresta MP MCP-T350 (manufactured by Dia Instruments Co., Ltd.). Thus, the surface resistivity values R0 and R1 (Ω/sq) of the surface of the electroconductive film on the organic electroconductive layer side were measured.

Production Example 1: Production of Hydrogenated Product of Ring-Opening Polymer of Dicyclopentadiene A pressure-resistant metal reaction vessel was sufficiently dried, and the inside of the reaction vessel was replaced by nitrogen. To the pressure-resistant metal reaction vessel, 154.5 parts of cyclohexane, 42.8 parts of 70% solution of dicyclopentadiene (endo-isomer content: 99% or more) in cyclohexane (amount of dicyclopentadiene: 30 parts), and 1.9 parts of 1-hexene were added, and the mixture was warmed to 53° C.

0.061 part of 19% solution of diethylaluminum ethoxide in n-hexane was added to a solution prepared by dissolving 0.014 part of tetrachlorotungsten phenylimide (tetrahydrofuran) complex in 0.70 part of toluene. The mixture was stirred for 10 minutes to prepare a catalyst solution.

This catalyst solution was added to the pressure resistant reaction vessel to initiate a ring-opening polymerization reaction. After that, the reaction was performed for 4 hours while the temperature was kept at 53° C. As a result, a solution of a ring-opening polymer of dicyclopentadiene was obtained.

The number-average molecular weight (Mn) and weight-average molecular weight (Mw) of the obtained ring-opening polymer of dicyclopentadiene were 8,750 and 28,100, respectively. The molecular weight distribution (Mw/Mn) calculated from these values was 3.21.

To 200 parts of the obtained solution of the ring-opening polymer of dicyclopentadiene, 0.037 part of 1,2-ethanediol as a terminator was added. The mixture was warmed to 60° C. and stirred for 1 hour, to terminate the polymerization reaction. To the mixture, 1 part of a hydrotalcite-like compound ("KYOWAAD (registered trademark) 2000" available from Kyowa Chemical Industry Co., Ltd.) was added. The mixture was warmed to 60° C. and stirred for 1 hour. After that, 0.4 part of a filter aid ("Radiolite (registered trademark) #1500" available from Showa Chemical Industry Co., Ltd.) was added, and the mixture was filtered through a PP pleated cartridge filter ("TCP-HX" available from Advantec Toyo Kaisha Ltd.) to separate the adsorbent and the solution.

To 200 parts of the filtered solution of the ring-opening polymer of dicyclopentadiene (amount of the polymer: 30 parts), 100 parts of cyclohexane was added, and 0.0043 part of chlorohydridecarbonyl tris(triphenylphosphine)ruthenium was then added. A hydrogenation reaction was performed at a hydrogen pressure of 6 MPa and 180° C. for 4 hours. As a result, a reaction liquid containing a hydrogenated product of the ring-opening polymer of dicyclopentadiene was obtained. This reaction liquid was a slurry solution in which the hydrogenated product was precipitated.

The hydrogenated product contained in the reaction liquid was separated from the solution using a centrifugal separator, and dried under reduced pressure at 60° C. for 24 hours, to obtain 28.5 parts of the hydrogenated product of the ring-opening polymer of dicyclopentadiene having crystallizability. The hydrogenation ratio of the hydrogenated product was 99% or more, the glass transition temperature Tg was 93° C., the melting point (Tm) was 262° C., and the ratio of racemo diad was 89%.

Production Example 2: Production of Primary Film 1

In 100 parts of the hydrogenated product of the ring-opening polymer of dicyclopentadiene obtained in Production Example 1, 1.1 parts of an antioxidant (tetrakis[methylene-3-(3',5'-di-t-butyl-4'-hydroxyphenyl)propionate]methane; "Irganox (registered trademark) 1010" available from BASF Japan Ltd.) was mixed, to obtain a resin as a material for a film. Hereinafter, this resin is referred to as "resin A".

The aforementioned resin A was put into a twin-screw extruder ("TEM-37B" manufactured by Toshiba Machine Co., Ltd.) having four die holes each having an inner diameter of 3 mm. The resin was molded by hot melt extrusion molding using the twin-screw extruder, to obtain a molded body in a strand shape. The molded body was finely cut with a strand cutter, to obtain pellets of the resin A. The operation conditions of the twin-screw extruder are as follows.

Barrel set temperature: 270° C. to 280° C.
Die set temperature: 250° C.
Screw rotation speed: 145 rpm
Feeder rotation speed: 50 rpm Subsequently, the obtained pellets were supplied to a hot melt extrusion film molding device equipped with a T-die. A long-length primary film 1 (width: 120 mm) formed of the aforementioned resin A was produced using this film-molding device by a method in which the film was wound up at a speed of 27 m/min into a roll. The operation conditions of the film-molding device are as follows.

Barrel temperature setting: 280° C. to 290° C.
Die temperature: 270° C.
Screw rotation speed: 30 rpm The thickness of the obtained primary film 1 was 11 µm.

Production Example 3: Production of Primary Film 2

A primary film 2 was produced by the same operation as that of Production Example 2 except that the take-up speed was changed from 27 m/min to 13.6 m/min. The thickness of the obtained primary film 2 was 22 µm.

Production Example 4: Production of Primary Film 3

A primary film 3 was produced by the same operation as that of Production Example 2 except that the take-up speed was changed from 27 m/min to 9 m/min. The thickness of the obtained primary film 3 was 33 µm.

Production Example 5: Production of Primary Film 4

A primary film 4 was produced by the same operation as that of Production Example 2 except that the take-up speed was changed from 27 m/min to 6.8 m/min. The thickness of the obtained primary film 4 was 44 µm.

Production Example 6: Production of Primary Film 5

A primary film 5 was produced by the same operation as that of Production Example 2 except that the take-up speed was changed from 27 m/min to 4.5 m/min. The thickness of the obtained primary film 5 was 66 µm.

Production Example 7: Production of Primary Film 6

Pellets of a norbornene-based resin ("ZEONOR1600" available from ZEON Corporation, Tg: 163° C., refractive index: 1.53; hereinafter referred to as "resin B") were prepared. The pellets were supplied to a hot melt extrusion film molding device equipped with a T-die. A long-length primary film 6 (width: 120 mm) formed of the aforementioned resin B was produced using this film-molding device by a method in which the film was wound up at a speed of 13.6 m/min into a roll. The operation conditions of the film-molding device are as follows.

Barrel temperature setting: 260° C.
Die temperature: 250° C.
Screw rotation speed: 30 rpm
The thickness of the obtained primary film 6 was 22 μm.

Example 1

(1-1. Stretching Step)

The long-length primary film 1 obtained in Production Example 2 was cut into a square shape of 350 mm×350 mm. The cutting was performed so that edges of the cut square of the primary film 1 were parallel to the lengthwise or width direction of the long-length primary film 1. The cut primary film 1 was set in a compact stretching machine ("EX10-B type" manufactured by Toyo Seiki Seisakusho, Ltd.). The compact stretching machine is provided with a plurality of clips for gripping four edges of the film, and has a configuration by which the film can be stretched by moving the clips. The oven temperature of this compact stretching machine was set to 110° C. By the compact stretching machine, the primary film 1 was stretched in a longitudinal direction corresponding to the lengthwise direction of the long-length primary film 1 at a stretching temperature of 110° C., a stretching speed of 1,000 mm/min, and a stretching ratio of 1.05. Subsequently, the primary film 1 was stretched in a transverse direction corresponding to the width direction of the long-length primary film 1 at the same stretching temperature and the same stretching speed as described above and a stretching ratio of 1.05. As a result, a stretched film was obtained.

(1-2. Crystallization Step)

Subsequently, while four edges of the stretched film were kept in the held state, secondary heating plates provided to the compact stretching machine were disposed in close proximity to surfaces on upper and lower sides of the stretched film, and held for 30 seconds. Thus, a heating treatment was performed to obtain a crystallized film 1. At that time, the temperature of the secondary heating plates was set to 200° C., and the distance between the secondary heating plate and the film on each of the upper and lower sides was set to 8 mm.

The thickness of the crystallized film 1 was 10 μm and the crystallization degree was 71%. The front surface retardation Re of the film was 6 nm.

(1-3. Organic Electroconductive Composition)

To 100 parts of an aqueous dispersion electroconductive coating material containing poly(3,4-ethylenedioxythiophene) and polysulfonic acid as main components and also containing a silane coupling agent (trade name: Orgacon S-300 available from Agfa-Gevaert Japan., Ltd.), 300 parts of ethylene glycol, 0.3 part of ethylene glycol diglycidyl ether, and 0.3 part of 3-glycidoxypropyl triethoxysilane were added, and the mixture was stirred for 1 hour until respective components became uniform. As a result, an organic electroconductive composition was prepared.

(1-4. Electroconductive Film)

The crystallized film 1 obtained in (1-2) was subjected to a corona treatment in the atmospheric air at an electrical discharge amount of 150 W/m$^2$/min using a corona treater manufactured by Kasuga Denki, Inc. The electroconductive composition obtained in (1-3) was applied onto a surface of the crystallized film 1 that had been subjected to a corona treatment so that the thickness after drying was 600 nm, to thereby form a coating film. The coating film was dried at 120° C. for 5 minutes, to form an organic electroconductive layer. As a result, a transparent electroconductive film including the crystallized film 1 as a substrate film and the organic electroconductive layer was obtained. The bend resistance of the obtained electroconductive film was evaluated.

Example 2

A crystallized film and an electroconductive film were obtained and evaluated by the same operation as that of Example 1 except that the primary film 2 (thickness of 22 μm) produced in Production Example 3 was used instead of the primary film 1.

Example 3

A crystallized film and an electroconductive film were obtained and evaluated by the same operation as that of
Example 1 except for the following matters.
  The primary film 2 (thickness of 22 μm) produced in Production Example 3 was used instead of the primary film 1.
  The temperature of the secondary heating plates in the crystallization step was changed from 200° C. to 160° C., and the holding time was changed from 30 seconds to 10 seconds.

Example 4

A crystallized film and an electroconductive film were obtained and evaluated by the same operation as that of Example 1 except that the primary film 3 (thickness of 33 μm) produced in Production Example 4 was used instead of the primary film 1.

Example 5

A crystallized film and an electroconductive film were obtained and evaluated by the same operation as that of Example 1 except that the primary film 4 (thickness of 44 μm) produced in Production Example 5 was used instead of the primary film 1.

Comparative Example 1

A crystallized film and an electroconductive film were obtained and evaluated by the same operation as that of Example 1 except that the primary film 5 (thickness of 66 μm) produced in Production Example 6 was used instead of the primary film 1.

Comparative Example 2

A crystallized film and an electroconductive film were obtained and evaluated by the same operation as that of Example 1 except for the following matters.
  The primary film 2 (thickness of 22 μm) produced in Production Example 3 was used instead of the primary film 1.
  The temperature of the secondary heating plates in the crystallization step was changed from 200° C. to 150° C., and the holding time was changed from 30 seconds to 5 seconds.

Comparative Example 3

(C3-1. Stretching Step)

A stretched film was obtained by the same operation as that of (1-1) of Example 1 except for the following matters. The thickness of the obtained stretched film was 30 The front surface retardation Re of the film was 2 nm.

The primary film 6 (thickness: 22 μm) produced in Production Example 7 was used instead of the primary film 1.

The stretching temperature was changed from 110° C. to 170° C.

(C3-2. Electroconductive Film)

An electroconductive film was obtained and evaluated by the same operation as that of (1-3) to (1-4) of Example 1 except that the stretched film obtained in (C3-1) as it was without performing a crystallization step was used instead of the crystallized film 1 obtained in (1-2).

[Comparative Example 4]

(C4-1. Stretching and Crystallization Step)

A crystallized film was obtained and evaluated by the same operation as that of (1-1) to (1-2) of Example 1 except that the primary film 2 (thickness: 22 μm) produced in Production Example 3 was used instead of the primary film 1.

(C4-2. Electroconductive Film)

A film formation device capable of forming an electroconductive layer on a surface of a resin film by a sputtering method was prepared. This film formation device is a magnetron sputtering device of film-winding type that is capable of forming a desired electroconductive layer on a surface of the resin film that is fixed on a long-length carrier film continuously conveyed in the device. As the carrier film, a polyethylene terephthalate film was used.

The crystallized film obtained in (C4-1) was fixed on the carrier with a polyimide tape. The carrier film was supplied to the film formation device, to form an electroconductive layer on a surface of the crystallized film. At that time, an $In_2O_3$—$SnO_2$ ceramic target was used as a sputtering target. The film formation conditions were an argon (Ar) flow rate of 150 sccm, an oxygen ($O_2$) flow rate of 10 sccm, an output of 4.0 kw, a degree of vacuum of 0.3 Pa, and a film conveyance speed of 0.5 m/min.

As a result, a transparent electroconductive layer formed of ITO with a thickness of 100 nm was formed on the surface of the crystallized film, to obtain an electroconductive film including an inorganic electroconductive layer and the crystallized film 2 as a substrate film. The bend resistance of the obtained electroconductive film was evaluated.

The results in Examples and Comparative Examples are shown in Table 1. The operations in the crystallization steps of Examples 1, 2, 4, and 5 and Comparative Examples 1 and 4 are the same. Although it was not intended to obtain films having different crystallization degrees, the crystallization degrees of the obtained films were slightly fluctuated.

Meanings of abbreviations in Table are as follows.

PEDOT: Organic electroconductive layer including poly (3,4-ethylenedioxythiophene) and polysulfonic acid as main components ITO: Inorganic electroconductive layer formed of ITO As clear from the results in Table 1, in Examples 1 to 5 in which the substrate films and the electroconductive layers satisfy the requirements of the present invention, high bend resistance was obtained as compared with cases where the thickness of the substrate film did not fall within a range defined by the present invention (Comparative Examples 1 and 2), a case where the material for the substrate film did not satisfy the requirements of the present invention (Comparative Example 3), and a case where the electroconductive layer did not satisfy the requirements of the present invention (Comparative Example 4).

The invention claimed is:

1. An electroconductive film comprising a substrate film, and an organic electroconductive layer disposed on the substrate film, wherein
   the substrate film is formed of a resin containing an alicyclic structure-containing polymer having crystallizability,
   a thickness of the substrate film is 5 μm or more and 50 μm or less,
   a crystallization degree of the alicyclic structure-containing polymer having crystallizability is 30% or more, and
   the alicyclic structure-containing polymer having crystallizability is a hydrogenated product of a ring-opening polymer of dicyclopentadiene.

2. The electroconductive film according to claim 1, wherein the organic electroconductive layer contains polyethylenedioxythiophene.

3. A method for producing the electroconductive film according to claim 1, the method comprising the steps of:
   preparing a primary film formed of the resin containing the alicyclic structure-containing polymer having crystallizability;
   obtaining the substrate film from the primary film; and
   forming the organic electroconductive layer on the substrate film.

4. The method for producing the electroconductive film according to claim 3, wherein
   the step of obtaining the substrate film includes
   a step of stretching the primary film, and
   a crystallization step of crystallizing the alicyclic structure-containing polymer contained in the primary film.

5. The method for producing the electroconductive film according to claim 4, wherein the crystallization step is

TABLE 1

|  | Substrate film type | Substrate film thickness (μm) | Crystallization degree (%) | Re (nm) | Electroconductive layer | Bend resistance |
|---|---|---|---|---|---|---|
| Ex. 1 | Resin A | 10 | 71 | 5 | PEDOT | A |
| Ex. 2 | Resin A | 20 | 68 | 6 | PEDOT | A |
| Ex. 3 | Resin A | 20 | 36 | 3 | PEDOT | B |
| Ex. 4 | Resin A | 30 | 65 | 8 | PEDOT | A |
| Ex. 5 | Resin A | 40 | 72 | 11 | PEDOT | B |
| Comp. Ex. 1 | Resin A | 60 | 64 | 15 | PEDOT | C |
| Comp. Ex. 2 | Resin A | 20 | 17 | 1 | PEDOT | C |
| Comp. Ex. 3 | Resin B | 30 | — | 2 | PEDOT | C |
| Comp. Ex. 4 | Resin A | 20 | 68 | 6 | ITO | C | performed at a temperature that is equal to or higher than a glass transition temperature Tg of the alicyclic structure-containing polymer and equal to or lower than a melting point Tm of the alicyclic structure-containing polymer in a strained state where at least two edges of the primary film are held.

* * * * *